United States Patent
Takahashi

Patent Number: 6,098,187
Date of Patent: Aug. 1, 2000

[54] METHOD FOR SELECTING OPERATION CYCLES OF A SEMICONDUCTOR IC FOR PERFORMING AN IDDQ TEST BY USING A LOGICAL SIMULATION AND A FAULT SIMULATION

[75] Inventor: Toshihiro Takahashi, Osaka, Japan

[73] Assignee: Ricoh Co., Ltd., Tokyo, Japan

[21] Appl. No.: 09/270,109

[22] Filed: Mar. 16, 1999

[30] Foreign Application Priority Data

Mar. 19, 1998 [JP] Japan .................................. 10-070254

[51] Int. Cl.[7] .................................................. G01R 31/28
[52] U.S. Cl. ............................................ 714/741; 714/738
[58] Field of Search .................................. 714/741, 726, 714/738

[56] References Cited

U.S. PATENT DOCUMENTS

| | | | |
|---|---|---|---|
| 4,763,289 | 8/1988 | Barzilai et al. | 395/500.23 |
| 5,726,997 | 3/1998 | Teene | 714/726 |
| 5,790,565 | 8/1998 | Sakaguchi | 714/738 |
| 5,944,847 | 8/1999 | Sanada | 714/741 |
| 5,983,381 | 11/1999 | Chakradhar | 714/738 |

OTHER PUBLICATIONS

High–Speed Animation and Simulation for Microcomputers, 1987, Adams, pp. 84–89.
Hardware–Accelerated Parallel–Pattern/Multiple–Fault–Propagation Concurrent Fault Simulation, Hahn, et al., IEEE, 1994.
An Algebra for Switch–Level Simulation, Hajj, IEEE, 1990.
Hardware–Accelerated Concurrent Fault Simulation: Event-flow Computing vs Dataflow Computing; Hahn, et al., IEEE, 1995.
Switch–Level Simulation Using Dynamic Graph Algorithms, Adler, IEEE, 1991.
Fault Simulation of Interconnect Opens in Digital CMOS Circuits, Konuk, IEEE, 1997.
Overcoming the Serial Logic Simulation Bottleneck in parallel Fault Simulation, Rudnick, et al., IEEE, 1996.
Weiwei Mao, et al., "Quietest: A Quiescent Current Testing Methodology for Detecting Leakage Faults", proceedings of the 1990 ICCAD conference held by IEEE, pp. 280–283.
U.S. patent application No. 09/139,716 filed on Aug. 25, 1998, Toshihiro Takahashi, et al.

*Primary Examiner*—Albert De Cady
*Assistant Examiner*—Guy Lamarre
*Attorney, Agent, or Firm*—Dickstein Shapiro Morin & Oshinsky LLP

[57] ABSTRACT

A sufficient and necessary number of operation cycles for detecting faults, which have not been found by a function test, are accurately and rapidly selected by performing a logical simulation of an operation of an integrated circuit including m internal nets. A fault simulation is performed by using a predetermined test pattern so as to specify internal nets for which a fault is detected. Standby cycles are detected from among operation cycles in the logical simulation. α internal nets at which a fault is detected by the fault simulation from among the m internal nets to be subjected to the IDDQ test are excluded. The standby cycles are selected as the IDDQ test cycles based on the (m–α) internal nets.

15 Claims, 8 Drawing Sheets

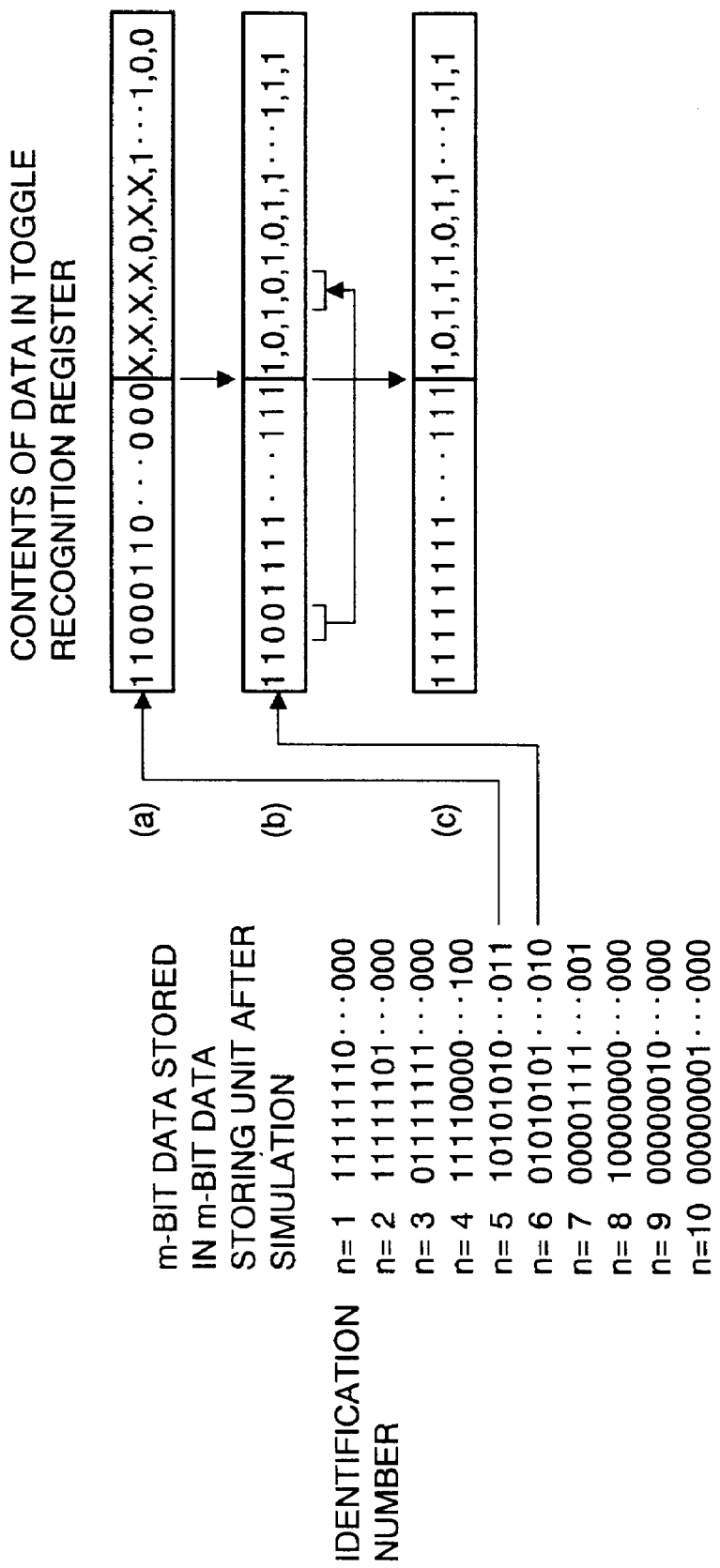

METHOD FOR SELECTING OPERATION CYCLES OF A SEMICONDUCTOR IC FOR PERFORMING AN IDDQ TEST BY USING A LOGICAL SIMULATION AND A FAULT SIMULATION

BACKGROUND OF THE INVENTION

1. Field of the Invention

The present invention generally relates to a method for testing a semiconductor integrated circuit and, more particularly, to a method for selecting operation cycles of a semiconductor integrated circuit so as to perform an IDDQ measurement in the selected operation cycles.

2. Description of the Related Art

As CMOS integrated circuits are increasingly highly integrated and are formed into fine structures, a frequency of occurrence of new fault modes which are difficult to find by a conventional functional test has been increasing. The new fault modes include an open fault and a short fault due to a fine structure of wiring between elements in a semiconductor integrated circuit. Thus, if only the functional test is performed for an inspection, a semiconductor integrated circuit which has one of the above-mentioned new faults may be delivered as a product which has passed the inspection and, thereby, the semiconductor integrated circuit having a fault may be assembled into a final product.

An IDDQ test is suggested to detect the above-mentioned new faults. In the IDDQ test, a measurement of quiescent power supply current (IDDQ) is performed so as to detect existence of a fault. Specifically, in the IDDQ test, a fine power-supply current flowing in a CMOS integrated circuit which is in a steady state (standby state) is measured so as to determine existence of a fault by a level of the power-supply current. In a normal CMOS integrated circuit, only a very small power-supply current flows. That is, if a large current flows in a CMOS integrated circuit in a standby state, this indicates that the CMOS integrated circuit includes a defect or fault therein. Although a state of an integrated circuit continuously changes during a normal operation, the IDDQ test can be performed during an operation cycle which is in a standby state.

A technique to detect the standby cycle by using logical simulation is known. For example, Japanese Laid-Open Patent Application No. 4-44172 suggests determining an operation cycle to be one which is in the standby state when the following four conditions are satisfied.

1) Output signals of a plurality of gates are not in conflict with each other (not a bus conflict state).

2) All of the gates connected to a bus are not in a high-impedance "Z" state.

3) A logical value at a node with a pull-up is in a high level "H".

4) A logical value at a node with a pull-down is in a low level "L".

If only a quality of test is considered, that is, if only a capability of detection of a fault is of concern, it is better to perform a test during various states of an operation. Accordingly, it is most appropriate to perform the test for all cycles in which the standby state is achieved. However, in practice, a number of the standby cycles used for the test should be as small as possible since a time for performing the test directly influences a manufacturing cost. That is, it is desired to reduce a time spent on the test as much as possible while maintaining a quality of a result of the test above an allowable level.

The IDDQ test includes measurement of a current as mentioned above. Generally, measurement of a current takes a longer time than that of measurement of a voltage. In order to reduce a time spent on the test, the number of measurements should be reduced. Accordingly, is it desired to select the number of standby cycles which is sufficient for maintaining a certain level of the quality of the test result. The following two papers suggest methods for selecting the standby cycles.

1) Kazuo Wakui, Toshinobu Ono and Masaaki Yoshida, "A pattern selection algorithm for IDDQ test", proceedings of 1995 Electronic Information Communication Electronics Society Conference, vol.2, p.185, C-463, September 1995.

First, an operator designates a number "n" of cycles in which the IDDQ test is performed. Then, a logical simulation is performed by inputting test patterns for a functional test so as to select and extract first n standby cycles. Then, a fault coverage is calculated for the n IDDQ tests. Thereafter, subsequent standby cycles are investigated one by one so as to check if the fault coverage is improved when each of the subsequent standby cycles is replaced with one of the first n standby cycles. If there is a standby cycle which improves the fault coverage, the standby cycle is replaced with the one of the first n standby cycles. This operation is performed with respect to all of the subsequent standby cycles.

2) Weiwei Mao, Ravi K. Gulati, Deepak K. Goel and Michael D. Ciletti, "QUIETEST: A Quiescent Current Testing Methodology for Detecting Leakage Faults", proceedings of the 1990 ICCAD conference held by IEEE, pp.280–283.

In the method disclosed in this document, a logical simulation is performed while referring to a fault table which is previously prepared by an operator. The fault table indicates which state of input corresponds to which type of fault with respect to each of the gates in a circuit. If the operator does not designate a number "n" of test cycles in which the IDDQ test is performed during execution of the logical simulation, a cycle from which at least one new fault can be detected is added to the test cycles. On the other hand, if the operator designates the number "n" of the test cycles, a cycle from which a number of new faults to be detected is greater than an expected number of faults per one cycle is added to the test cycles.

In the method suggested by Wakui et al., there is a problem in that an operator must designate the number "n" of the test cycles. That is, the number of cycles sufficient for obtaining a desired accuracy of detection cannot be decided previously. Accordingly, the operator is forced to designate an uncertain number of cycles. Thus, the number of cycles designated by the operator may be insufficient for obtaining a desired result, or may be in excess. Whichever happens, an appropriate number of cycles cannot be obtained in most cases.

Additionally, in the method suggested by Wakui et al., there is another problem in that a possibility for replacement of one of the first n standby cycles must be checked with all of the standby cycles subsequent to the first n standby cycles, and this operation takes a long time. In an extreme case, the first n standby cycles may remain at the end of the operation for checking a possibility of replacement. However, even in such a case, all standby cycles must be checked in this method. Thus, a time is wasted for the checking operation. Especially, if the number of test patterns for a functional test is extremely large, such a wasted time may be a serious problem.

In the method suggested by Mao et al., there is a problem in that the fault table must be prepared previously although the fault table once prepared can be commonly used for other circuits. This method also has the same problem as the method suggested by Wakui et al. when the number "n" of cycles for performing the IDDQ test is designated by an operator. Additionally, there may be a problem in that a result desired by the operator cannot be obtained when the operator does not designate the number "n" of cycles for performing the IDDQ test.

Consideration will now be given of a case in which all faults can be detected by the last two cycles of a series of operation cycles in the test patterns for a functional test. In this case, since the operation cycles are sequentially checked with respect to passage of time, it is possible that cycles preceding the last two cycles are selected. As a result, there is a problem in that an excessive number of standby cycles are selected for the IDDQ test.

As mentioned above, a manufactured semiconductor integrated circuit device must be subjected to a function test so as to check functional operations thereof. A part of a fault found in such a function test may be detected in the IDDQ test which is performed after the function test is completed so as to supplement the function test.

However, the conventional IDDQ test does not consider the above-mentioned matter. That is, the conventional IDDQ test is performed while selecting and extracting test cycles or test patterns with all faults as targets to be detected. Accordingly, the conventional IDDQ test has the following problems.

1) A time for testing a semiconductor integrated circuit device is unnecessarily increased, which directly causes an increase in a manufacturing cost of the semiconductor integrated circuit device.

2) A time spent by an IDDQ test apparatus for checking a single semiconductor integrated circuit device is unnecessarily increased, which increases a manufacturing cost of the semiconductor integrated circuit device.

SUMMARY OF THE INVENTION

It is a general object of the present invention to provide an improved and useful method for selecting operation cycles of a semiconductor integrated circuit for performing an IDDQ test in which the above-mentioned problems are eliminated.

A more specific object of the present invention is to provide a method for selecting operation cycles to be subjected to an IDDQ test from among operation cycles defined by a test pattern for a function test of a semiconductor integrated circuit device so that a sufficient and necessary number of operation cycles for detecting faults, which have not been found by the function test, are accurately and rapidly selected.

In order to achieve the above-mentioned objects, there is provided according to one aspect of the present invention a method for selecting IDDQ test cycles by performing a logical simulation of an operation of an integrated circuit including m internal nets, the method comprising the steps of:

performing a fault simulation by using a predetermined test pattern so as to specify internal nets for which a fault is detected;

detecting standby cycles which are in a standby state from among operation cycles in the logical simulation;

excluding α internal nets at which a fault is detected by the fault simulation from among the m internal nets to be subjected to the IDDQ test; and selecting at least one of the standby cycles as the IDDQ test cycle based on the (m−α) internal nets.

According to the present invention, since faults detected by the fault simulation are excluded from the objects for the IDDQ test, the number of internal nets to be checked by the IDDQ test cycle selecting process can be reduced. Thus, a time spent on the IDDQ test cycle selecting process can be reduced.

The method for selecting IDDQ test cycles according to the present invention may further comprise the steps of:

storing n sets of m-bit data corresponding to the detected standby cycles, each set of m-bit data comprising m bits representing a state of the respective m internal nets included in the integrated circuit; and preparing a toggled flag for each of the m bits of the set of m-bit data, the toggled flag indicating whether the corresponding bit of the set of m-bit data has been set to both values "0" and "1" at least once, wherein the step of excluding includes the step of raising the toggled flag for each of the bit positions corresponding to the internal nets for which both a stuck-at-0 fault and a stuck-at-1 fault are detected by the fault simulation.

In this invention, the toggled flag indicating a state of the corresponding internal net is raised when the internal net is subjected to detection of both the stuck-at-0 fault and the stuck-at-1 fault. Accordingly, the internal net which is not required to be checked can be effectively eliminated from the objects to be checked by the IDDQ test.

Additionally, the method for selecting IDDQ test cycles may further comprise the step of:

preparing untoggled data comprising m sets of bit data each of which indicates whether one of a stuck-at-0 fault and a stuck-at-1 fault is detected for the corresponding one of the m internal nets so that each set of bit data of the untoggled data is set to "1" when only a stuck-at-0 fault is detected and is set to "0" when a stuck-at-1 fault is detected.

Further, in the method for selecting IDDQ test cycles according to the present invention, the step of selecting may include the steps of:

selecting one of the n sets of m-bit data of which untoggled data has a maximum Hamming distance from immediately preceding toggled data with respect to positions corresponding to the toggled flags which are not raised;

updating the untoggled data by comparing the immediately preceding toggled data with the untoggled data of the selected one of the n sets of m-bit data so that each set of bit data of the untoggled data which changes from one of the values "0" and "1" to the other is set to the value "1", and raising the toggled flag for a position corresponding to each set of bit data of the untoggled data which changes from one of the values "0" and "1" to the other;

selecting one of the unselected sets of m-bit data of which toggled data has a maximum Hamming distance from the updated toggled data with respect to positions corresponding to the toggled flags which are not raised;

repeating the step of updating and the step of selecting one of the unselected sets of m-bit data until a predetermined condition is satisfied; and rendering the standby cycles corresponding to the previously selected sets of m-bit data to be the IDDQ test cycles.

Additionally, the predetermined condition of the step of repeating may be satisfied when a number of raised toggled flags exceeds a predetermined number.

Alternatively, the predetermined condition of the step of repeating may be satisfied when a predetermined number of standby cycles which are rendered to be the IDDQ test cycles is selected.

Additionally, there is provided according to another aspect of the present invention a method for selecting IDDQ test cycles by performing a logical simulation of an operation of an integrated circuit including a plurality of internal nets, the method comprising the steps of:

Starting the logical simulation of the operation of the integrated circuit;

determining whether an operation cycle in the logical simulation is a standby cycle, a determination being performed on an individual operation cycle basis;

storing a set of m-bit data corresponding to a first IDDQ test cycle as a reference set of m-bit data, the set of m-bit data comprising a number of bits corresponding to the number of internal nets included in the integrated circuit;

preparing a toggled flag for each of the m bits of the reference set of m-bit data, the toggled flag indicating whether the corresponding bit of the set of m-bit data has been set to both values "0" and "1" at least once, and preparing untoggled data comprising m sets of bit data each of which indicates whether one of a stuck-at-0 fault and a stuck-at-1 fault is detected by the fault simulation for the corresponding one of the m internal nets so that each set of bit data of the untoggled data is set to "1" when only a stuck-at-0 fault is detected and is set to "0" when a stuck-at-1 fault is detected;

selecting a first IDDQ test cycle which is determined to be the standby cycle first;

setting the toggled flags and the untoggled data in accordance with a state of each of the m internal bits determined by the logical simulation;

setting a reference value with respect to a Hamming distance in accordance with a set of m-bit data which comprises a number of bits corresponding to the number of internal nets included in the integrated circuit;

continuing the logical simulation and selecting a second IDDQ test cycle which is determined to be the standby cycle so that a set of m-bit data corresponding to the second IDDQ test cycle has the toggled data having a Hamming distance greater than the reference value with respect to positions corresponding to the toggled flags which are not raised;

updating the untoggled data by comparing the immediately preceding toggled data with the untoggled data of the selected one of the n sets of m-bit data so that each set of bit data of the untoggled data which changes from one of the values "0" and "1" to the other is set to the value "1", and raising the toggled flag for a position corresponding to each set of bit data of the untoggled data which changes from one of the values "0" and "1" to the other;

selecting one of the unselected sets of m-bit data of which toggled data has a maximum Hamming distance from the updated toggled data with respect to positions corresponding to the toggled flags which are not raised;

repeating the step of updating and the step of selecting one of the unselected sets of m-bit data until a predetermined condition is satisfied; and rendering the standby cycles corresponding to the previously selected sets of m-bit data to be the IDDQ test cycles.

According to this invention, the IDDQ test cycle selecting operation progresses in association with the progress of the logical simulation. Accordingly, the IDDQ test cycle selecting operation can be completed substantially at the same time as when the logical simulation is completed. Thus, a result of the selection of the IDDQ test cycles can be rapidly obtained.

According to another aspect of the present invention, there is provided a computer readable medium which stores program code means for achieving the above-mentioned method for selecting the IDDQ test cycles.

Additionally, there is provided according to another aspect of the present invention an IDDQ test cycle selecting system for selecting IDDQ test cycles by performing a logical simulation of an operation of an integrated circuit including m internal nets, the IDDQ test cycle selecting system comprising:

a fault simulation apparatus performing a fault simulation by using a predetermined test pattern so as to specify internal nets at which a fault is detected;

a detecting unit detecting standby cycles which are in a standby state from among operation cycles in the logical simulation;

a fault net excluding unit excluding $\alpha$ internal nets at which a fault is detected by the fault simulation from among the m internal nets to be subjected to the IDDQ test; and a selecting unit selecting at least one of the standby cycles as the IDDQ test cycle based on the (m−$\alpha$) internal nets.

Other objects, features and advantages of the present invention will become more apparent from the following detailed description when read in conjunction with the accompanying drawings.

BRIEF DESCRIPTION OF THE DRAWINGS

FIG. 7 is an illustration for explaining execution of the process shown in FIG. 3 for selecting IDDQ test cycles;

DETAILED DESCRIPTION OF THE PREFERRED EMBODIMENTS

Figure 1:
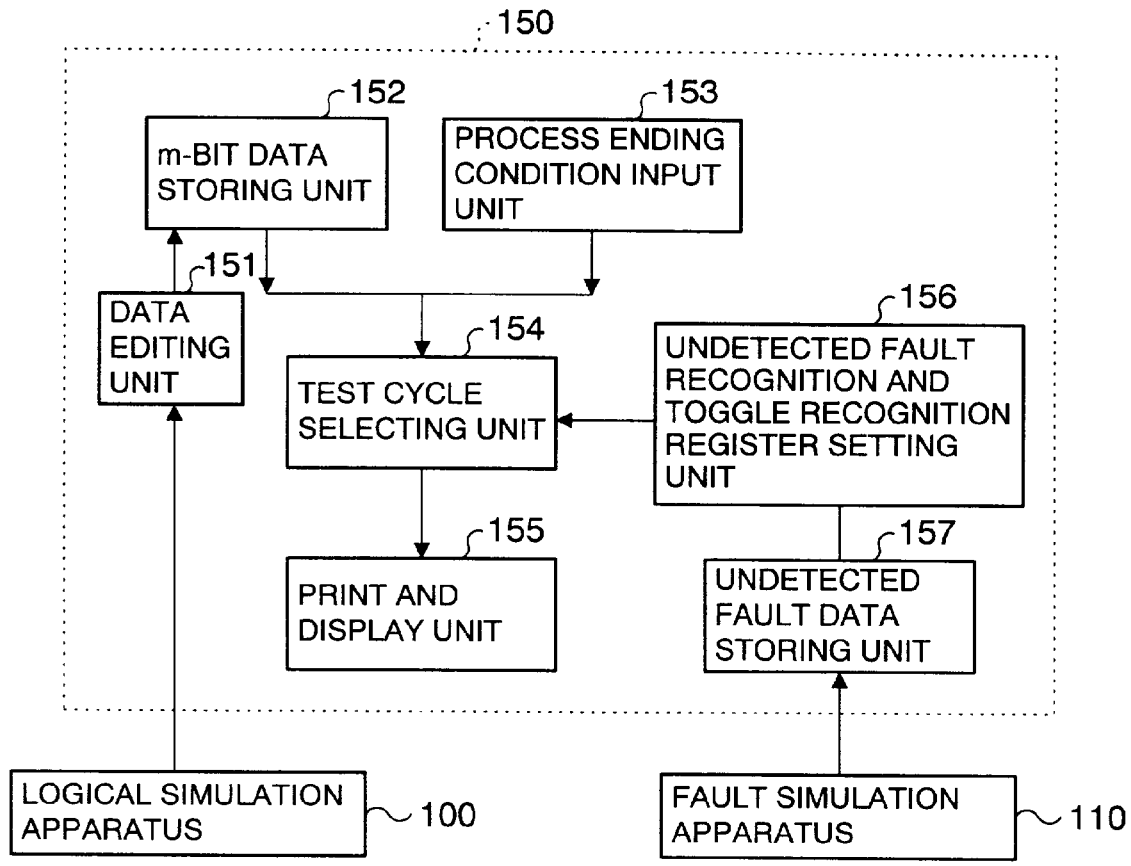
FIG. 1 is a block diagram of an IDDQ test cycle selecting system which performs a method according to a first embodiment of the present invention.

A description will now be given of a first embodiment of the present invention. FIG. 1 is a block diagram of an IDDQ test cycle selecting system 150 which performs a method according to the first embodiment of the present invention.

In FIG. 1, a logical simulation apparatus 100 performs a simulation of an operation of a CMOS integrated circuit described with HDL (Hardware Design Language). The logical simulation apparatus 100 supplies information with respect to standby cycles and information with respect to internal nets or nodes of the CMOS integrated circuit to the. IDDQ test cycle selecting system 150 in accordance with results of the simulation.

A fault simulation apparatus 110 is connected to the IDDQ test cycle selecting system 150 as an external apparatus. The fault simulation apparatus 110 performs a fault simulation so as to obtain fault information, and outputs the fault information to a undetected fault data storing unit 157 of the IDDQ test cycle selecting system 150. The fault information includes information with respect to a type of fault (a stuck-at-0 fault or a stuck-at-1 fault) detected by the fault simulation apparatus 110 and a position (a net or node of the CMOS integrated circuit) at which each fault is detected. The fault information may include information with respect to a type of fault which cannot be detected at each net or node. It should be noted that a fault specified based on a result of a fault simulation performed by using a predetermined test pattern is the same as that detected by a function test using the same test pattern.

In the IDDQ test cycle selecting system 150, a data editing unit 151 receives information regarding a result of logical simulation from the logical simulation apparatus 100. The data editing unit 151 specifies m internal nets from among M internal nets of the entire circuit so that the m internal nets are subjected to a process for selecting the IDDQ test cycles. The data editing unit 151 outputs m-bit data which represents a signal state of each of the specified m internal nets. If n standby cycles appear in the logical simulation, the number of sets of the above-mentioned m-bit data is n.

It should be noted that the data editing unit 151 may use all of the M internal nets as the internal nets to be subjected to the process for selecting the IDDQ test cycles. Additionally, with respect to an element such as an inverter or a buffer in which an input and an output are provided on a one-to-one basis, one of the input net and the output net may be used as an internal net to be subjected to the process for selecting the IDDQ test cycles. Further, the internal nets used in the process for selecting the IDDQ test can be designated by a setting operation of an operator, or may be designated on a unit basis such as a functional block, a hierarchical structure or a power-supply system. The M internal nets present in the logic circuit can be specified based on the described data of the logic circuit stored in the logical simulation apparatus 100. It should be noted that the data editing unit 151 can be provided in the logical simulation apparatus 100.

In the IDDQ test cycle selecting system 150, an m-bit storing unit 152 stores m-bit data output from the data editing unit 151. A process ending condition input unit 153 is a man-machine interface for externally setting a condition for selecting the IDDQ test cycles used in the IDDQ test performed by a test cycle selecting unit 154. The process ending condition input unit 153 also sets a condition for ending the process for selecting IDDQ test cycles.

An undetected fault recognition and toggle recognition register setting unit 156 sets a toggle recognition register based on information regarding each net which information is stored in the undetected fault data stored in the undetected fault data storing unit 157. The toggle recognition register stores toggled flags each of which indicates whether the respective bit of the m-bit data has been set to both values of "1" and "0". The toggle recognition register also stores values of data corresponding to each bit which has not been set to both values of "1" and "0". The undetected fault recognition and toggle recognition register setting unit 156 sets the value of "1" to each toggled flag corresponding to a net for which a fault can be detected by a function test based on the information stored in the undetected fault data storing unit 157.

The m-bit data storing unit 152 stores n sets of the m-bit data which represents states of the m nets in the circuit to be tested. The test cycle selecting unit 154 selects a combination of a minimum number of standby cycles from among n standby cycles. In the combination of standby cycles, each of the bits of the m-bit data, each of which indicates a state of the respective m internal nets, takes both values "1" and "0" at least once. That is, each bit of the m-bit data changes from "0" to "1" or from "1" to "0" between the operation cycles of the selected combination. It should be noted that each net for which a fault can be detected by a function test is eliminated from the objects to be subjected to the test cycle selecting and extracting process from among the m nets specified by the data editing unit 151. Accordingly, a time needed for the IDDQ test is reduced since duplicate detection of the same fault by the function test and the IDDQ test is prevented.

A print and display unit 155 prints or displays information indicating a position of each of the standby cycles selected by the test cycle selecting unit 154, the position being counted from a first operation cycle in the logical simulation.

Figure 2:
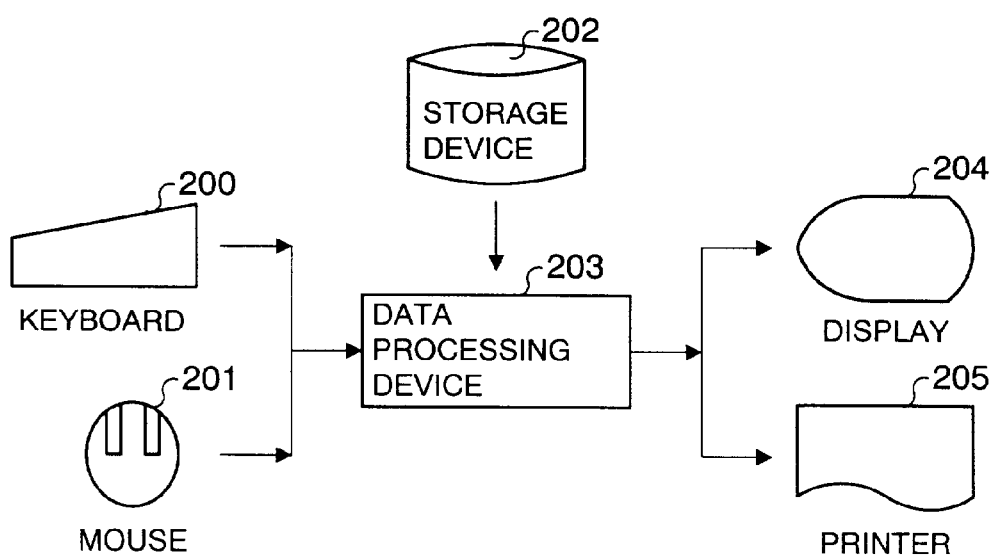
FIG. 2 is an illustration showing a hardware structure of the IDDQ test cycle selecting system shown in FIG. 1.

FIG. 2 is an illustration showing a hardware structure of the IDDQ test cycle selecting system 150. As shown in FIG. 2, the IDDQ test cycle selecting system 150 comprises a keyboard 200, a mouse 201, a storage device 202, a data processing device 203, a display 204 and a printer 205.

The keyboard 200 and the mouse 201 together serve as the process ending condition input unit 153 shown in FIG. 1. The storage device 202 serves as the m-bit data storing unit 152 and the undetected fault data storing unit 157 shown in FIG. 1. The data processing device 203 comprises a central processing unit (CPU) and a memory for storing programs of a process for selecting the IDDQ test cycles. The CPU of the data processing device 203 executes the programs of the process for selecting the IDDQ test cycles stored in the memory so as to serve as the data editing unit 151, the test cycle selecting unit 154 and the undetected fault recognition and toggle recognition register setting unit 156. The display 204 and the printer 205 serve as the print and display unit 155 shown in FIG. 1.

Figure 3:
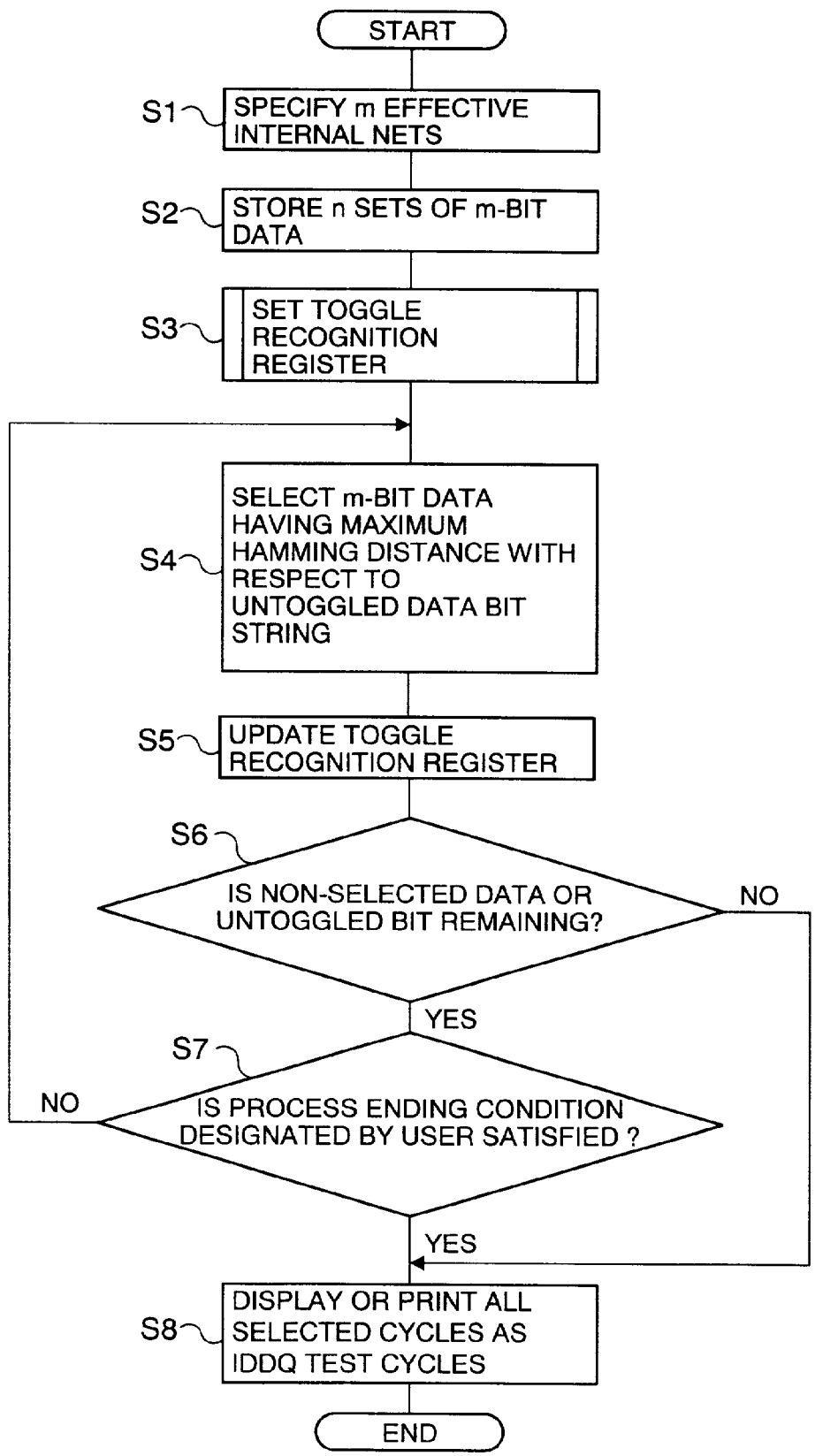
FIG. 3 is a flowchart of a process for selecting IDDQ test cycles, which process is performed by a data processing device shown in FIG. 2.

FIG. 3 is a flowchart of the process for selecting the IDDQ test cycles, which process is performed by the data processing device 203. A description will now be given, with reference to FIG. 3, of the process for selecting the IDDQ test cycles.

When the process is started, the m internal nets to be subjected to the IDDQ test cycle selecting process are specified, in step S1, based on the information with respect to the internal nets of the CMOS integrated circuit, which information is supplied by the logical simulation apparatus 100. It should be noted that all of the M internal nets may be used as the internal nets to be subjected to the process for selecting the IDDQ test cycles. Additionally, with respect to an element such as an inverter or a buffer in which an input and an output are provided on a one-to-one basis, one of the input net and the output net may be used as an internal net to be subjected to the process for selecting the IDDQ test cycles. Further, the internal nets used in the process for selecting the IDDQ test can be designated by a setting operation of an operator, or may be designated on a unit basis such as a functional block, a hierarchical structure or a power-supply system.

Thereafter, in step S2, n standby cycles are detected from among operation cycles with respect to the m internal nets specified in step S1. The logical values of the internal nets in each of the detected standby cycles are arranged in a predetermined order so as to form m-bit data. The thus-formed m-bit data is stored in the storage device 202.

The n sets of m-bit data are stored in the storage device 202 with data indicating a position of the operation cycle from the first operation cycle of the logical simulation. Each m-bit data is provided with an identification number from 1 to n starting from one which appears first in the sequence of the logical simulation. Since a technique for determining whether or not a standby state is achieved in an operation cycle is known, for example, in Japanese Laid-Open Patent Application No.4-44172, descriptions thereof will be omitted.

Figure 4:
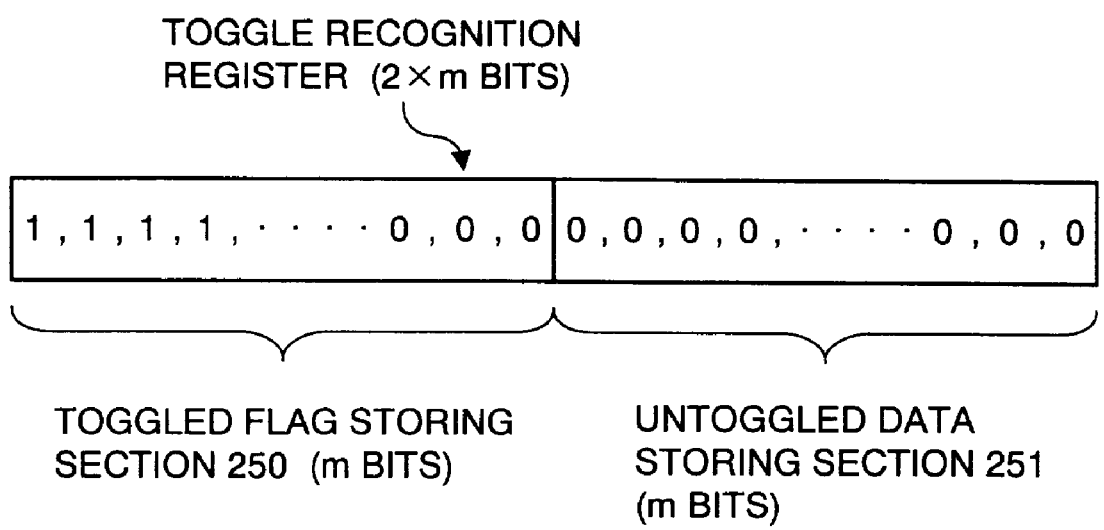
FIG. 4 is an illustration of a toggle recognition register.

Thereafter, in step S3, the toggle recognition register is set. As shown in FIG. 4, the toggle recognition register comprises a toggled flag storing section 250 and an untoggled data storing section 251. The toggle recognition register is achieved by a memory provided in the data processing device 203. Each of the toggled flags stored in the toggled flag storing section 250 takes one of the values "1" and "0". Each of the toggled flags is set to "1" when it is determined that the corresponding bit of the m-bit data has been toggled. Additionally, the untoggled data storing section 251 stores a data value of each bit of the m-bit data which has not been toggled. It should be noted that each data value of the untoggled data may comprise two bits since each data value must represent three states including the values "0" and "1" and an unestablished state. However, in this specification, each data value of the untoggled data is represented as a single bit for the sake of convenience.

In the above-mentioned step S3, the toggled flag storing unit 250 and the untoggled data storing unit 251 are set so that a fault detected by a function test is eliminated from the objects to be subjected to the IDDQ test. For example, the value "1" is set to the corresponding toggled flag corresponding to a net at which both a stuck-at-0 fault and a stuck-at-1 fault are detected by the fault simulation performed by using a predetermined test pattern. The process of step S3 will be described in detail later.

Then, attention is given to each bit (data value) of the untoggled data, which bit corresponds to a corresponding bit of one of the selected sets of the m-bit data. Each bit of the untoggled data to be considered has the value "0" or "1", and corresponds to one of the toggled flags stored in the toggled flag storing section 250, which toggled flags have the value "0". Hereinafter, such a bit may be referred to as an untoggled data bit. In step S4, data obtained by extracting the untoggled data bits is compared with data obtained by extracting the bit values of one of the selected sets of m-bit data, the bit values corresponding to the bit positions of the untoggled data bits, so as to select one of the selected sets of m-bit data from which the data obtained by extracting the bit values has a maximum Hamming distance from the data obtained by extracting the untoggled data bits.

A description will now be given of the process of step S4 in detail. It is assumed that the contents of the toggled flag storing section 250 set in step S3 are "1111...000" and the contents of the untoggled data storing section 251 are "XXXX...000", where X represents the unestablished state of the untoggled data bit. Hereinafter the untoggled data bit in the unestablished state may be referred to as unestablished data X. It should be noted that information regarding the unestablished data X is stored in a memory provided in the data processing device 203.

It is assumed that, for the sake of convenience, the data represented by "..." corresponds to the toggled flags set to the value "1". In such a case, the data obtained from the untoggled data bits is represented by 3-bit data "001". Accordingly, in step S4, a set of m-bit data having 3-bit data which has a maximum Hamming distance from the 3-bit data "001" is selected from among a plurality of sets of m-bit data which have not been selected. For example, if there is m-bit data "ΔΔΔΔ...110" (Δ is an arbitrary value), this m-bit data is selected.

In step S5, the values of the untoggled data bits corresponding to the toggled flags set to the value "0" in the toggled flag storing section 250 of the toggle recognition register are compared with the corresponding bit values of the selected set of m-bit data so as to update the toggled flags in the toggle recognition register. That is, a toggle flag set to the value "0" is changed to "1" when the bit value at the corresponding position of the selected m-bit data is "1". It should be noted that, at this time of updating, the unestablished data X in the untoggled data storing section 251 is rendered to be the corresponding bit values of the selected m-bit data. It is then determined, in step S6, whether or not there is a toggled flag which has not been set to the value "1" or whether or not there is m-bit data which has not been selected yet. If it is determined that there is a toggled flag which has not been set to the value "1" or there is m-bit data which has not been selected yet, the routine proceeds to step S7. In step S7, it is determined whether or not a process ending condition designated by the operator is satisfied. If it is determined that the process ending condition is not satisfied, the routine returns to step S4 so as to continue the process.

On the other hand, if it is determined, in step S6, that values of all of the toggled flags have been set to "1" or the n sets of m-bit data have been selected, the routine proceeds to step S8 so as to print the result of the process.

Additionally, even if the determination of step S6 is affirmative, if it is determined, in step S7, that the process ending condition designated by the operator is satisfied, the routine proceeds to step S8 so as to print the result of the process. In step S8, the selected cycles are rendered to be the IDDQ test cycles, and the information indicating positions of the IDDQ test cycles from the first operation cycle of the logical simulation is displayed on the display 204 and also printed by the printer 205.

Figure 5:
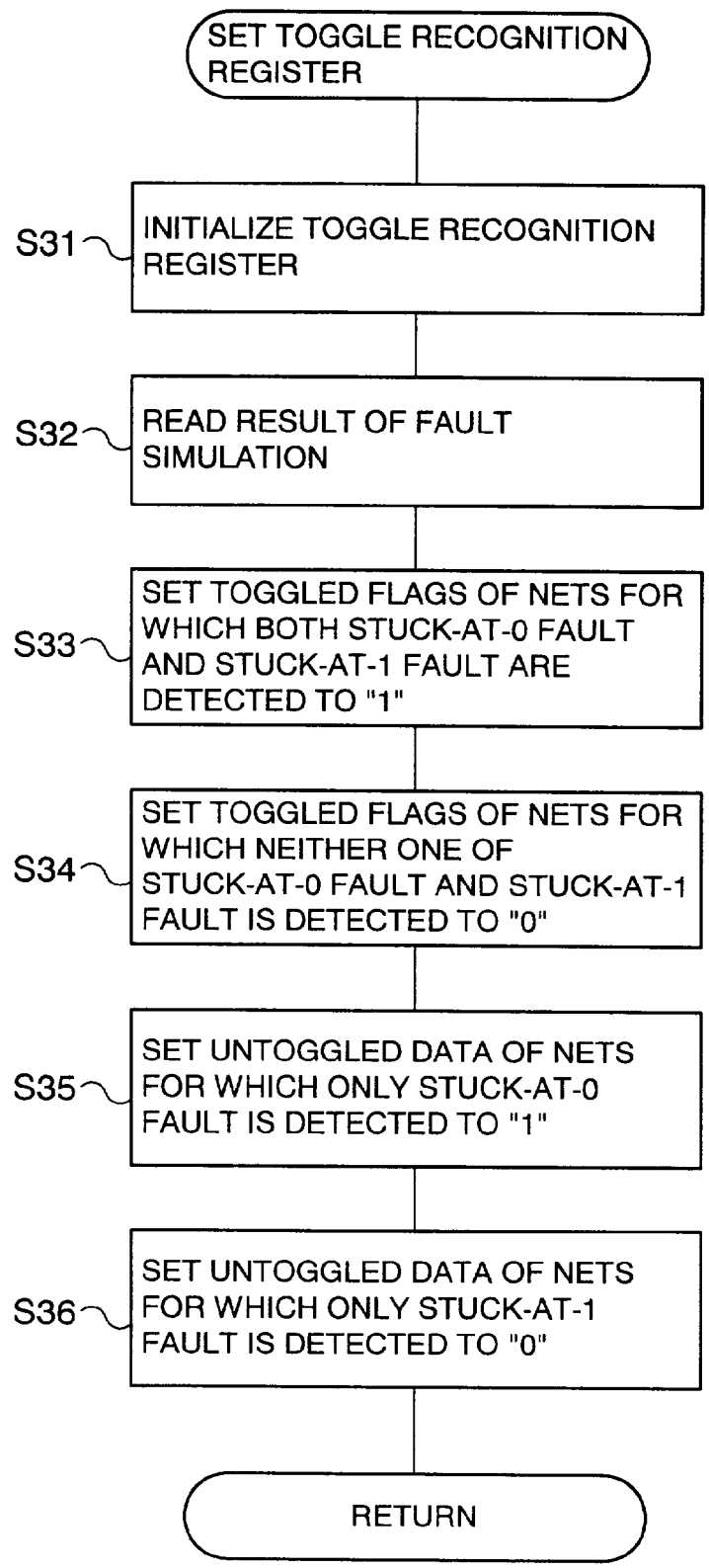
FIG. 5 is a flowchart of a setting operation of the toggle recognition register shown in FIG. 4.

FIG. 5 is a flowchart of a setting operation of the toggle recognition register shown in FIG. 4. FIGS. 6A, 6B, 6C, 6D and 6E are illustrations for explaining contents of the toggle recognition register shown in FIG. 4. A description will now be given, with reference to FIG. 5 and FIGS. 6A to 6E, of the setting operation of the toggle recognition register.

Figure 6A:
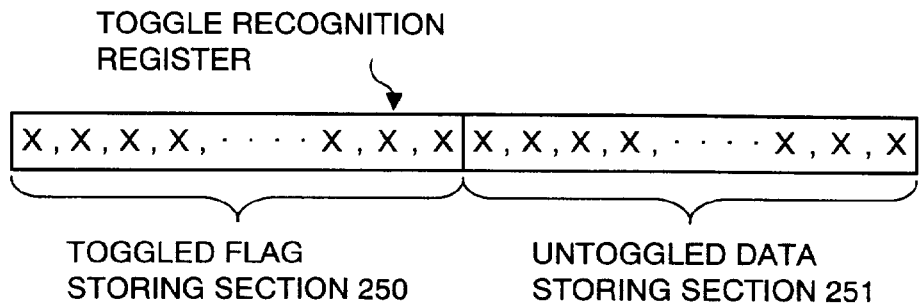
FIGS. 6A, 6B, 6C, 6D and 6E are illustrations for explaining contents of the toggle recognition register shown in FIG. 4.

First, in step S31, an initialization process for the toggle recognition register is performed. In the initialization process, each of the sets of bit data in the toggled flag storing section 250 and the untoggled data storing section 251 is rendered to be the unestablished data X as indicated in FIG. 6A. It should be noted that information representing whether each bit data is the unestablished data X is stored in a memory provided in the data processing device 203.

Figure 6B:
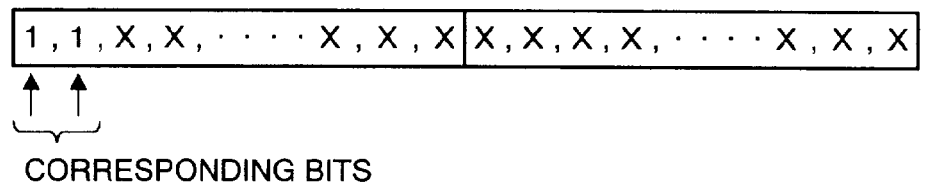

Thereafter, in step S32, a result of a fault simulation performed by using a predetermined test pattern is read from the undetected fault data storing unit 157. In step S33, each of the toggled flags corresponding to the nets at which the stuck-at-0 fault and the stuck-at-1 fault are detected is set to "1" since there is no need to detect a fault by the IDDQ test. For example, when the first and second most significant bits of the m-bit data, which bits correspond to such a net at which detection of a fault is not necessary, the corresponding bits of the toggled flag storing section 250 are set to "1" as shown in FIG. 6B. It should be noted that the first and second bit data in the untoggled data storing section 251 are maintained to be the unestablished data X.

Figure 6C:
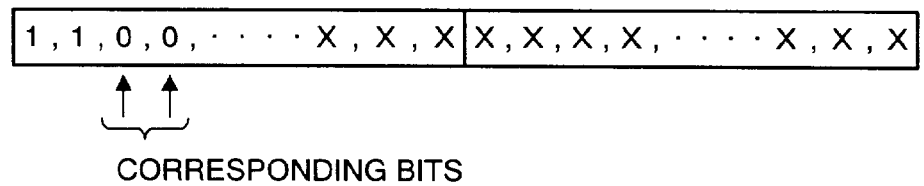

On the other hand, the IDDQ test must be performed for the nets at which neither the stuck-at-0 fault nor the stuck-at-1 fault is detected. Thus, the IDDQ test must be performed in a state in which each of the nets is set to each of the values "0" and "1". Accordingly, in step S34, the toggled flag corresponding to each of the above-mentioned nets (bits) is set to "0" and the corresponding untoggled data bit is maintained as the unestablished data X. For example, when the third and fourth most significant bits of the m-bit data correspond to such nets, the corresponding toggled flags in the toggled flag storing section 250 are set to "0", as shown in FIG. 6C.

Figure 6D:
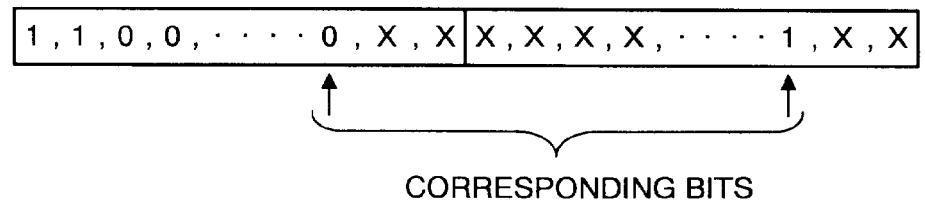

Additionally, the IDDQ test must be performed for each of the nets at which only the stuck-at-0 fault is detected. Thus, the IDDQ test must be performed in a state in which each of such nets is set to the value "0" so as to detect the stuck-at-1 fault. Accordingly, in step S35, the untoggled data bit corresponding to each of such nets is set to "1" and the toggled flag corresponding to each of such bits is set to "0". For example, if the third least significant bit of the m-bit data, which bit corresponds to such a net at which detection of the stuck-at-1 fault is necessary, the third least significant untoggled data bit is set to "1" and the corresponding toggled flag is set to "0", as shown in FIG. 6D.

Figure 6E:
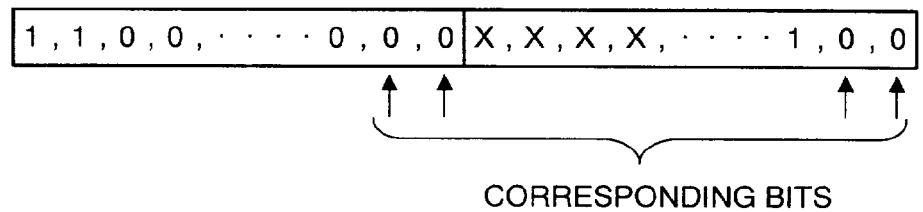

Additionally, the IDDQ test must be performed for each of the nets at which only the stuck-at-1 fault is detected. Thus, the IDDQ test must be performed in a state in which each of such nets is set to the value "1" so as to detect the stuck-at-0 fault. Accordingly, in step S36, the untoggled data bit corresponding to each of such nets is set to "0" and the toggled flag corresponding to each of such bits is set to "0". For example, if the first and second least significant bits of the m-bit data, which bits correspond to such nets at which detection of the stuck-at-0 fault is necessary, each of the first and second untoggled data bits is set to "0" and each of the corresponding toggled flags is set to "0", as shown in FIG. 6E.

According to the above-mentioned process, the toggle recognition register which specifies the target faults other than faults specified by the fault simulation can be set.

FIG. 7 is an illustration for explaining execution of the process shown in FIG. 3 for selecting the IDDQ test cycles. In the example of FIG. 7, ten sets of m-bit data, which sets are determined as standby cycles, are selected by performing a logical simulation on the CMOS integrated circuit having m internal nets, and the selected ten sets of m-bit data are stored in the storage device 202.

It is assumed that the toggle recognition register which is set in step S3 of the flowchart shown in FIG. 3 is in a state shown in FIG. 7-($a$). In this case, one of the sets of m-bit data is selected in the subsequent step S4 by the following method. First, untoggled data bits having the value "0" or "1" are extracted from the untoggled data storing section 251, which untoggled data bits correspond to the toggled flags set to the value "0". The extracted untoggled data bits are sequentially arranged so as to produce an untoggled data bit string. In the case of FIG. 7-($a$), the untoggled data bit string is "01···100". Then, one of the ten sets of m-bit data is selected so that a data bit string of the selected m-bit data, which data string corresponding to the untoggled data bit string, has a maximum Hamming distance from the untoggled data bit string. In the case of FIG. 7, the m-bit data having an identification number n=5 is selected. Then, in step S5, the toggled flags in the toggle recognition register are updated as shown in FIG. 7-($b$). At this time, the untoggled data bits in the untoggled data storing section 251, which bits are indicated as unestablished data X, are replaced by the corresponding bit values of the m-bit data having the identification number n=5.

In the state shown in FIG. 7-($b$), untoggled data bits corresponding to the toggled flags which are set to the value of "0" still remain in the untoggled data storing section 251 of the toggle recognition register. This condition causes an affirmative determination (YES) in step S6. In this case, if an ending condition designated by a user is not satisfied (NO of step S7), the m-bit data selecting process (step S4) and the toggle recognition register updating process (step S5) are repeated. In the state of FIG. 7-($b$), a data bit string of the m-bit data having the identification number n=6 has a maximum hamming distance from the untoggled data bit string obtained from the toggle recognition register shown in FIG. 7-($b$). Thus, the m-bit data having the identification number n=6 is selected in step S4. By selecting the m-bit data having the identification number n=6, all of the data bits in the toggled flag storing section 250 of the toggle recognition register are set to the value of "1".

When all of the data bits in the toggled flag storing section 250 of the toggle recognition register are set to the value of "1", the two sets of m-bit data, that is, the m-bit data having the identification number n=5 and the m-bit data having the identification number n=6, are selected as cycles to be used by the IDDQ test. Accordingly, information regarding a position of each of the selected cycles from the first cycle of the logical simulation is displayed on the display 204, and may be output by the printer 205.

As mentioned above, according to the IDDQ test cycle selecting apparatus according to the first embodiment of the present invention, α nets or nodes at which a fault is detected by a function test are eliminated from the m nets or nodes to be subjected to IDDQ test so as to select the IDDQ test cycles by using the remaining (m−α) nets. Accordingly, the IDDQ test cycles can be selected based on a reduced number of nets. Thus, a minimum number of IDDQ test cycles required for performing the IDDQ test can be rapidly and accurately selected.

A description will now be given of a second embodiment of the present invention.

In the above-mentioned first embodiment, the IDDQ test cycles are selected after the logical simulation of the operation of the CMOS integrated circuit has been completed by the logical simulation apparatus. On the other hand, a method according to the second embodiment of the present invention selects the IDDQ test cycles while the logical simulation of the CMOS integrated circuit is being performed.

Figure 8:
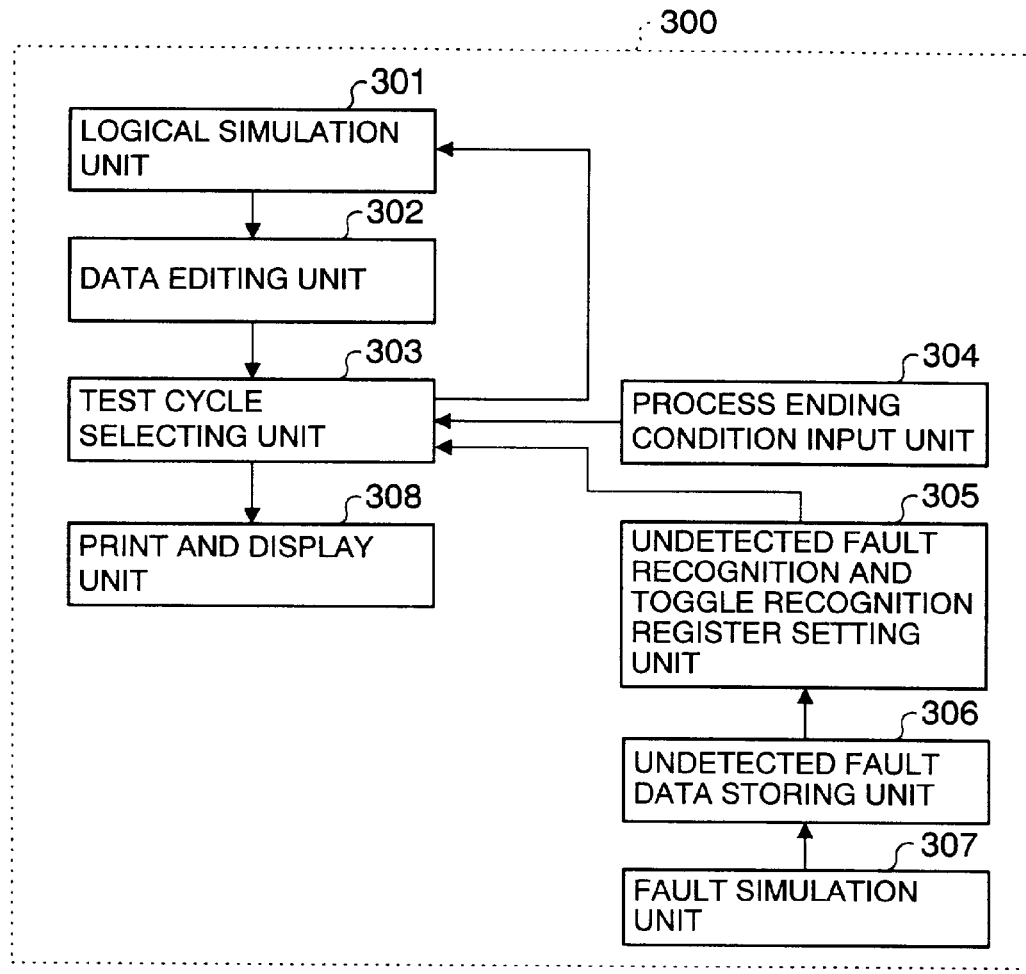
FIG. 8 is a block diagram of an IDDQ test cycle selecting system which performs an IDDQ test cycle selecting method according to a second embodiment of the present invention.

FIG. 8 is a block diagram of an IDDQ test cycle selecting system 300 which performs the IDDQ test cycle selecting method according to the second embodiment of the present invention.

In the IDDQ test cycle selecting system 300 shown in FIG. 8, a logical simulation unit 301 performs a logical simulation of an operation of a CMOS integrated circuit described with HDL (Hardware Description Language) in accordance with a timing control by a test cycle selecting unit 303 so as to output results of the simulation to a data editing unit 302 on an individual cycle basis.

The data editing unit 302 receives the information from the logical simulation unit 301. The data editing unit 302 specifies m internal nets from among M internal nets of the entire circuit so that the m internal nets are subjected to a process for selecting the IDDQ test cycles. The data editing unit 302 outputs m-bit data which represents a signal state of each of the specified m internal nets. It should be noted that the data editing unit 302 performs a process the same as the process performed by the data editing unit 151 provided in the IDDQ test cycle selecting system 150 shown in FIG. 1, and a description thereof will be omitted.

The test cycle selecting unit 303 determines a set of m-bit data as the IDDQ test cycle only when the set of m-bit data, which is supplied via the data editing unit 302, satisfies a predetermined condition with respect to a Hamming distance from the m-bit data corresponding to the cycle extracted immediately before. The test cycle selecting unit 303 sends an instruction to the logical simulation unit 301 after the determination for one operation cycle is completed.

A process ending condition input unit 304 is a man-machine interface for externally setting a condition for selecting the IDDQ test cycles used in the IDDQ test performed by the test cycle selecting unit 303. The process ending condition input unit 304 also sets a condition for ending the process for selecting IDDQ test cycles.

A fault simulation unit 307 has the same function as the fault simulation apparatus 110 shown in FIG. 1. That is, the fault simulation unit 307 performs a fault simulation by using a predetermined test pattern, and outputs fault information obtained from a result of the fault simulation to an undetected fault data storing unit 306. The fault information supplied to the fault data storing unit 306 includes information with respect to a type of fault (a stuck-at-0 fault or a stuck-at-1 fault) detected by the fault simulation unit 307 and a position (a net or node of a semiconductor integrated circuit device) at which each fault is detected. The fault information may include information with respect to a type of fault which cannot be detected at each net or node.

It should be noted that the undetected fault data storing unit 306 serves the same function as the undetected fault data storing unit 157 provided in the IDDQ test cycle selecting system 150 according to the above-mentioned first embodiment of the present invention.

When the test cycle selecting process is performed by the test cycle selecting unit 303, a fault detected by the function test is omitted from the objects to be subjected to the test cycle selecting process. Accordingly, the same fault is prevented from being detected twice, and, thereby, a time needed for the IDDQ test can be reduced.

An undetected fault recognition and toggle recognition register setting unit 305 sets a toggle recognition register based on information regarding each net, which information is stored in the undetected fault data stored in the undetected fault data storing unit 306. The undetected fault recognition and toggle recognition register setting unit 305 performs the same process as the undetected fault recognition and toggle recognition register setting unit 156 provided in the IDDQ test cycle selecting system 150, and a description thereof will be omitted.

A print and display unit 308 prints or displays information indicating a position of each of the standby cycles selected by the test cycle selecting unit 303, the position being counted from a first operation cycle in the logical simulation.

Figure 9:
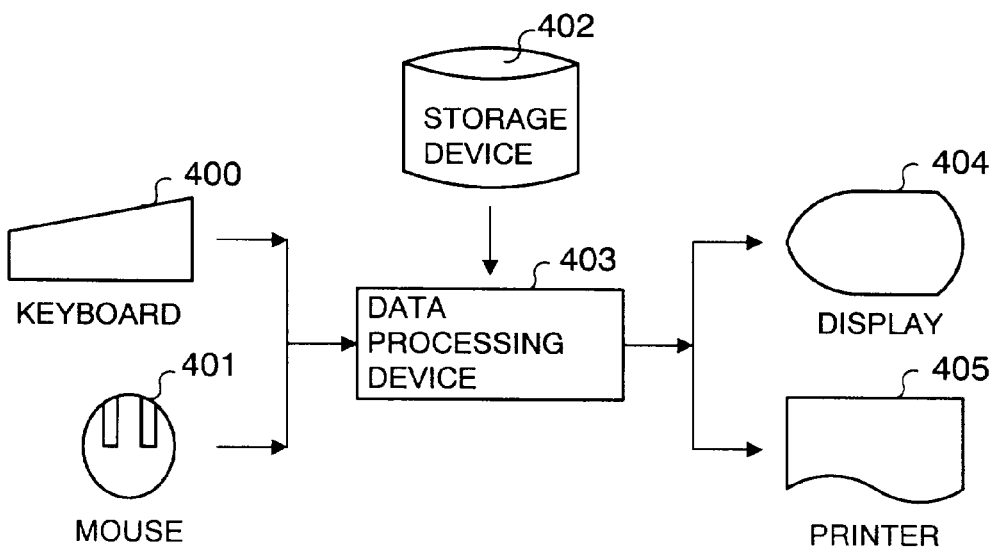
FIG. 9 is an illustration showing a hardware structure of the IDDQ test cycle selecting system shown in FIG. 8.

FIG. 9 is an illustration showing a hardware structure of the IDDQ test cycle selecting system 300. As shown in FIG. 9, the IDDQ test sample selecting system 300 comprises a keyboard 400, a mouse 401, a storage device 402, a data processing device 403, a display 404 and a printer 405.

The keyboard 400 and the mouse 401 together serve as the process ending condition input unit 304 shown in FIG. 8. The data processing device 403 comprises a central processing unit (CPU) and a memory for storing programs of a process for selecting the IDDQ test cycles. The CPU of the data processing device 403 executes the programs of the process for selecting the IDDQ test cycles stored in the memory so as to serve as the data editing unit 302 and the test cycle selecting unit 303. The display 404 and the printer 405 serve as the print and display unit 308 shown in FIG. 8.

Additionally, a logical simulation program and a fault simulation program are stored in a memory provided in the data processing device 403. A CPU provided in the data processing device 403 executes these programs as necessary.

Figure 10:
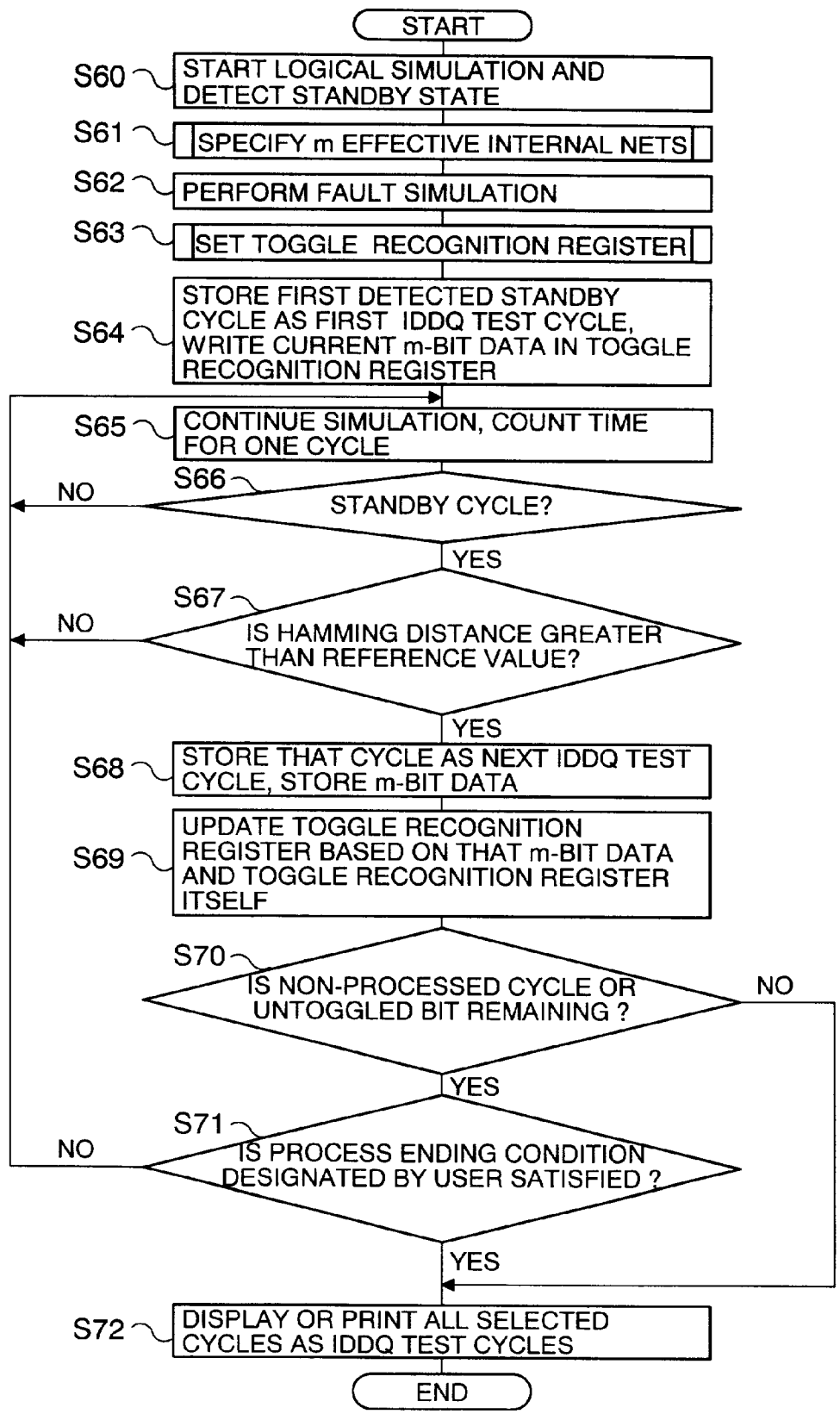
FIG. 10 is a flowchart of a process for selecting IDDQ test cycles, which process is performed by a data processing device shown in FIG. 8.

FIG. 10 is a flowchart of the process for selecting the IDDQ test cycles, which process is performed by the data processing device 403. A description will now be given, with reference to FIG. 10, of the process for selecting the IDDQ test cycles.

When the process of FIG. 10 is started, simulation of an operation of a CMOS integrated circuit is started by the logical simulation apparatus 301, in step S60, so as to detect the first standby cycle by checking a state of each net of the circuit in each operation cycle. Then, in step S61, m internal nets to be subjected to the IDDQ test are specified based on the information regarding the internal nets of the CMOS integrated circuit supplied by the logical simulation unit 301. It should be noted that the above-mentioned process is the same as the process of step S1 performed by the data processing device 203 of the first embodiment according to the present invention, and a description thereof will be omitted.

In step S62, the fault simulation is performed by using a predetermined test pattern so as to obtain the fault information. As mentioned above, the fault information includes information with respect to a type of fault (a stuck-at-0 fault or a stuck-at-1 fault) detected by the fault simulation unit 307 and a position (a net or node of a semiconductor integrated circuit device) at which each fault is detected. The fault information may include information with respect to a type of fault which cannot be detected at each net or node.

After the fault simulation is completed, a setting operation for the toggle recognition register is performed in step S63. In step S63, the bit values in the toggled flag storing section 250 and the untoggled data storing section 251 are set so as to exclude the faults detected by the function test. For example, each of the toggled flags corresponding to a net at which both the stuck-at-0 fault and the stuck-at-1 fault are detected is set to the value of "1".

It should be noted that the structure of the toggle recognition register is the same as that used by the IDDQ test cycle selecting system 150 according to the above-mentioned first embodiment of the present invention. That is, the toggle recognition register comprises the toggled flag storing section 250 and the untoggled data storing section 251, and is achieved by a memory provided in the data processing device 403. The setting process for the toggle recognition register is the same as that of the setting process (step S3 of FIG. 3) described with reference to FIGS. 5 and FIGS. 6A to 6E, and a description thereof will be omitted.

Thereafter, in step S64, a standby cycle which is detected first is rendered to be a first IDDQ test cycle, and information regarding a position of the first IDDQ test cycle from the first operation cycle in the simulation and information indicating that the IDDQ test cycle is selected first are stored in the storage device 402. Additionally, m-bit data represented by logic values of each net in the cycle, which m-bit data is arranged in a predetermined order, is stored in the storage device 402. Further, the toggled flags and the untoggled data stored in the toggle recognition register are updated.

Thereafter, in step S65, the logical simulation is continued, and a time count is proceeded by one cycle. It is then determined, in step S66, whether or not the current cycle is a standby cycle. If it is determined that the current cycle is not a standby cycle, the routine returns to step S65 so as to perform the logical simulation on a subsequent cycle.

On the other hand, if the current cycle is a standby cycle, the routine proceeds to step S67. In step S67, it is determined whether a Hamming distance between the m-bit data corresponding to the standby cycle determined in step S66, that is, the current cycle, is greater than a predetermined reference value with respect to the untoggled data corresponding to the bit positions for which the corresponding toggled flags are set to the value of "0". That is, the determination of the Hamming distance is based on only the untoggled data corresponding to the bit positions for which the toggled flags are "0".

If it is determined that the Hamming distance is not greater than the reference value, the routine returns to S65 so as to continue the logical simulation for the subsequent cycle. The above-mentioned reference value is changed according to a predetermined schedule in response to a number of bits corresponding to the toggled flags which are set to "0". For example, if the number of bits corresponding to the toggled flags set to "0" is P (m≧p), the reference value is set to p–2. It should be noted that the reference value is set to 1 if P≦2.

On the other hand, if it is determined, in step S66, that the current cycle is a standby cycle, and if it is determined, in step S67, that the Hamming distance is greater than the reference value, the current cycle is selected as the next IDDQ test cycle in step S68. Then, information regarding the position of the selected IDDQ test cycle from the first operation cycle in the simulation and information indicating that the IDDQ test cycle is selected second are stored in the storage device 402. Additionally, the m-bit data represented by the logic values corresponding to the nets in the current cycle, which m-bit data is arranged in a predetermined order, is also stored in the storage device 402.

Thereafter, in step S69, the m-bit data corresponding to the IDDQ test cycle selected in step S68 is compared with the m-bit data corresponding to the IDDQ test cycle selected immediately before so as to update the toggled flags in the toggled flag storing section of the toggle recognition register.

It is then determined, in step S70, whether or not there is a toggled flag which has not been set to the value "1" or whether or not there is m-bit data which has not been selected yet. If it is determined that there is a toggled flag which has not been set to the value "1" or there is m-bit data which has not been selected yet, the routine proceeds to step S71. In step S71, it is determined whether or not a process ending condition designated by the operator is satisfied. If it is determined that the process ending condition is not satisfied, the routine returns to step S65 so as to continue the process.

On the other hand, if it is determined, in step S70, that values of all of the toggled flags have been set to "1" or the n sets of m-bit data have been selected, the routine proceeds to step S72 so as to print the result of the process.

Additionally, even if the determination of step S70 is affirmative, if it is determined, in step S71, that the process ending condition designated by the operator is satisfied, the routine proceeds to step S72 so as to print the result of the process. In step S72, the selected cycles are rendered to be the IDDQ test cycles, and the information indicating positions of the IDDQ test cycles from the first operation cycle of the logical simulation is displayed on the display 404 and is also printed by the printer 405.

As mentioned above, the IDDQ test cycle selecting system 300 according to the second embodiment of the present invention, similar to the IDDQ test cycle selecting system 150 according to the first embodiment of the present invention, can select the necessary and sufficient number of IDDQ test cycles in a short time by excluding the faults detected by the function test.

Additionally, the IDDQ test cycle selecting system 300 selects the IDDQ test cycles in association with the progress of the simulation performed by the logical simulation apparatus 301. Thus, the process for selecting the IDDQ test cycles is completed at the same time the logical simulation is completed. Thereby, a process time can be reduced.

The present invention is not limited to the specifically disclosed embodiments, and variations and modifications may be made without departing from the scope of the present invention.

The present application is based on Japanese priority application No.10-70254 filed on Mar. 19, 1998, the entire contents of which are hereby incorporated by reference.

What is claimed is:

1. A method for selecting IDDQ test cycles by performing a logical simulation of an operation of an integrated circuit including m internal nets, the method comprising the steps of:

performing a fault simulation by using a predetermined test pattern so as to specify internal nets at which a fault is detected;

detecting standby cycles which are in a standby state from among operation cycles in the logical simulation;

excluding α internal nets at which a fault is detected by the fault simulation from among the m internal nets to be subjected to the IDDQ test such that faults detected by the fault simulation are excluded from the IDDQ test; and selecting at least one of the standby cycles as the IDDQ test cycle based on the (m–α) internal nets.

2. The method for selecting IDDQ test cycles as claimed in claim 1, further comprising the steps of:

storing n sets of m-bit data corresponding to the detected standby cycles, each set of m-bit data comprising m bits representing a state of the respective m internal nets included in the integrated circuit; and preparing a toggled flag for each of the m bits of the set of m-bit data, the toggled flag indicating whether the corresponding bit of the set of m-bit data has been set to both values "0" and "1" at least once, wherein the step of excluding includes the step of raising the toggled flag for each of the bit positions corresponding to the internal nets at which both a stuck-at-0 fault and a stuck-at-1 fault are detected by the fault simulation.

3. The method for selecting IDDQ test cycles as claimed in claim 2, further comprising the step of:

preparing untoggled data comprising m sets of bit data, each set of which indicates whether one of a stuck-at-0 fault and a stuck-at-1 fault is detected for the corresponding one of the m internal nets, so that each set of bit data of the untoggled data is set to "1" when only a stuck-at-0 fault is detected and each set of bit data of the untoggled data is set to "0" when a stuck-at-1 fault is detected.

4. The method for selecting IDDQ test cycles as claimed in claim 3, wherein the step of selecting includes the steps of:

selecting one of the n sets of m-bit data of which untoggled data has a maximum Hamming distance from immediately preceding toggled data with respect to positions corresponding to the toggled flags which are not raised;

updating the untoggled data by comparing the immediately preceding toggled data with the untoggled data of the selected one of the n sets of m-bit data so that each set of bit data of the untoggled data which changes from one of the values "0" and "1" to the other is set to the value "1", and raising the toggled flag for a position corresponding to each set of bit data of the untoggled data which changes from one of the values "0" and "1" to the other;

selecting one of the unselected sets of m-bit data of which toggled data has a maximum Hamming distance from the updated toggled data with respect to positions corresponding to the toggled flags which are not raised;

repeating the step of updating and the step of selecting one of the unselected sets of m-bit data until a predetermined condition is satisfied; and rendering the standby cycles corresponding to the previously selected sets of m-bit data to be the IDDQ test cycles.

5. The method for selecting IDDQ test cycles as claimed in claim 4, wherein the predetermined condition of the step of repeating is satisfied when a number of raised toggled flags exceeds a predetermined number.

6. The method for selecting IDDQ test cycles as claimed in claim 4, wherein the predetermined condition of the step of repeating is satisfied when a predetermined number of standby cycles which are rendered to be the IDDQ test cycles is selected.

7. A method for selecting IDDQ test cycles by performing a logical simulation of an operation of an integrated circuit including a plurality of internal nets, the method comprising the steps of:

starting a logical simulation of the operation of said integrated circuit;

determining whether an operation cycle in the logical simulation is a standby cycle, a determination being performed on an individual operation cycle basis;

storing a set of m-bit data corresponding to a first IDDQ test cycle as a reference set of m-bit data, the set of m-bit data comprising a number of bits corresponding to the number of internal nets included in said integrated circuit;

preparing a toggled flag for each of the m bits of the reference set of m-bit data, the toggled flag indicating whether the corresponding bit of the set of m-bit data has been set to both values "0" and "1" at least once, and preparing untoggled data comprising m sets of bit data each of which indicates whether one of a stuck-at-0 fault and a stuck-at-1 fault is detected by a fault simulation for the corresponding one of the m internal nets so that each set of bit data of the untoggled data is set to "1" when only a stuck-at-0 fault is detected and is set to "0" when a stuck-at-1 fault is detected;

selecting a first IDDQ test cycle which is determined to be the standby cycle first;

setting the toggled flags and the untoggled data in accordance with a state of each of the m internal bits determined by the logical simulation;

setting a reference value with respect to a Hamming distance in accordance with a set of m-bit data which comprises a number of bits corresponding to the number of internal nets included in said integrated circuit;

continuing the logical simulation and selecting a second IDDQ test cycle which is determined to be the standby cycle so that a set of m-bit data corresponding to said second IDDQ test cycle has the toggled data having a Hamming distance greater than said reference value with respect to positions corresponding to the toggled flags which are not raised;

updating the untoggled data by comparing the immediately preceding toggled data with the untoggled data of the selected one of the n sets of m-bit data so that each set of bit data of the untoggled data which changes from one of the values "0" and "1" to the other is set to the value "1", and raising the toggled flag for a position corresponding to each set of bit data of the untoggled data which changes from one of the values "0" and "1" to the other;

selecting one of the unselected sets of m-bit data of which toggled data has a maximum Hamming distance from the updated toggled data with respect to positions corresponding to the toggled flags which are not raised;

repeating the step of updating and the step of selecting one of the unselected sets of m-bit data until a predetermined condition is satisfied; and rendering the standby cycles corresponding to the previously selected sets of m-bit data to be the IDDQ test cycles, wherein faults detected by the fault simulation are excluded from the IDDQ test.

8. The method for selecting IDDQ test cycles as claimed in claim 7, wherein the predetermined condition of the step of repeating is satisfied when a number of raised toggled flags exceeds a predetermined number.

9. The method for selecting IDDQ test cycles as claimed in claim 7, wherein the predetermined condition of the step of repeating is satisfied when a predetermined number of standby cycles which are rendered to be the IDDQ test cycles are selected.

10. A processor readable medium storing program code means for causing a computer to select IDDQ test cycles by performing a logical simulation of an operation of an integrated circuit including m internal nets, comprising:

first program code means for performing a fault simulation by using a predetermined test pattern so as to specify internal nets at which a fault is detected;

second program code means for detecting standby cycles which are in a standby state from among operation cycles in the logical simulation;

third program code means for excluding α internal nets at which a fault is detected by the fault simulation from among the m internal nets to be subjected to the IDDQ test such that faults detected by the fault simulation are excluded from the IDDQ test; and fourth program code means for selecting at least one of the standby cycles as the IDDQ test cycle based on the (m−α) internal nets.

11. The processor readable medium as claimed in claim 10, further comprising:

program code means for storing n sets of m-bit data corresponding to the detected standby cycles, each set of m-bit data comprising m bits representing a state of the respective m internal nets included in said integrated circuit; and program code means for preparing a toggled flag for each of the m bits of the set of m-bit data, the toggled flag indicating whether the corresponding bit of the set of m-bit data has been set to both values "0" and "1" at least once, wherein the third program code means includes program code means for raising the toggled flag for each of the bit positions corresponding to the internal nets for which both a stuck-at-0 fault and a stuck-at-1 fault are detected by the fault simulation.

12. The processor readable medium as claimed in claim 11, further comprising:

program code means for preparing untoggled data comprising m sets of bit data, each set of which indicates whether one of a stuck-at-0 fault and a stuck-at-1 fault is detected for the corresponding one of the m internal nets so that each set of bit data of the untoggled data is set to "1" when only a stuck-at-0 fault is detected and is set to "0" when a stuck-at-1 fault is detected.

13. The processor readable medium as claimed in claim 12, wherein the fourth program code means includes:

program code means for selecting one of the n sets of m-bit data of which untoggled data has a maximum Hamming distance from immediately preceding toggled data with respect to positions corresponding to the toggled flags which are not raised;

program code means for updating the untoggled data by comparing the immediately preceding toggled data with the untoggled data of the selected one of the n sets of m-bit data so that each set of bit data of the untoggled data which changes from one of the values "0" and "1" to the other is set to the value "1", and raising the toggled flag for a position corresponding to each set of bit data of the untoggled data which changes from one of the values "0" and "1" to the other;

program code means for selecting one of the unselected sets of m-bit data of which toggled data has a maximum Hamming distance from the updated toggled data with respect to positions corresponding to the toggled flags which are not raised;

program code means for repeating the program code means for updating and the program code means for selecting one of the unselected sets of m-bit data until a predetermined condition is satisfied; and program code means for rendering the standby cycles corresponding to the previously selected sets of m-bit data to be the IDDQ test cycles.

14. A processor readable medium for storing program code means for causing a computer to select IDDQ test cycles by performing a logical simulation of an operation of an integrated circuit including a plurality of internal nets, comprising:

first program code means for starting the logical simulation of the operation of said integrated circuit;

second program code means for determining whether an operation cycle in the logical simulation is a standby cycle, a determination being performed on an individual operation cycle basis;

third program code means for storing a set of m-bit data corresponding to a first IDDQ test cycle as a reference set of m-bit data, the set of m-bit data comprising a number of bits corresponding to the number of internal nets included in said integrated circuit;

fourth program code means for preparing a toggled flag for each of the m bits of the reference set of m-bit data, the toggled flag indicating whether the corresponding bit of the set of m-bit data has been set to both values "0" and "1" at least once, and preparing untoggled data comprising m sets of bit data each of which indicates whether one of a stuck-at-0 fault and a stuck-at-1 fault is detected by a fault simulation for the corresponding one of the m internal nets so that each set of bit data of the untoggled data is set to "1" when only a stuck-at-0 fault is detected and is set to "0" when a stuck-at-1 fault is detected;

fifth program code means for selecting a first IDDQ test cycle which is determined to be the standby cycle first;

sixth program code means for setting the toggled flags and the untoggled data in accordance with a state of each of the m internal bits determined by the logical simulation;

seventh program code means for setting a reference value with respect to a Hamming distance in accordance with a set of m-bit data which comprises a number of bits corresponding to the number of internal nets included in said integrated circuit;

ninth program code means for continuing the logical simulation and selecting a second IDDQ test cycle which is determined to be the standby cycle so that a set of m-bit data corresponding to said second IDDQ test cycle has the toggled data having a Hamming distance greater than said reference value with respect to positions corresponding to the toggled flags which are not raised;

tenth program code means for updating the untoggled data by comparing the immediately preceding toggled data with the untoggled data of the selected one of the n sets of m-bit data so that each set of bit data of the untoggled data which changes from one of the values "0" and "1" to the other is set to the value "1", and raising the toggled flag for a position corresponding to each set of bit data of the untoggled data which changes from one of the values "0" and "1" to the other;

eleventh program code means for selecting one of the unselected sets of m-bit data of which toggled data has a maximum Hamming distance from the updated toggled data with respect to positions corresponding to the toggled flags which are not raised;

twelfth program code means for repeating the tenth program code means and the eleventh program code means until a predetermined condition is satisfied; and rendering the standby cycles corresponding to the previously selected sets of m-bit data to be the IDDQ test cycles, wherein faults detected by the fault simulation are excluded from the IDDQ test.

15. An IDDQ test cycle selecting system for selecting IDDQ test cycles by performing a logical simulation of an operation of an integrated circuit including m internal nets, the IDDQ test cycle selecting system comprising:

a fault simulation apparatus performing a fault simulation by using a predetermined test pattern so as to specify internal nets at which a fault is detected;

a detecting unit detecting standby cycles which are in a standby state from among operation cycles in the logical simulation;

a fault net excluding unit excluding $\alpha$ internal nets at which a fault is detected by the fault simulation from among the m internal nets to be subjected to the IDDQ test such that faults detected by the fault simulation are excluded from the IDDQ test; and a selecting unit selecting at least one of the standby cycles as the IDDQ test cycle based on the $(m-\alpha)$ internal nets.

* * * * *